United States Patent [19]

Exposito

[11] Patent Number: 5,841,192
[45] Date of Patent: Nov. 24, 1998

[54] INJECTION MOLDED BALL GRID ARRAY CASING

[75] Inventor: Juan Exposito, Saint Nazaire les Eymes, France

[73] Assignee: SGS-Thomson Microelectronics S.A., Saint Genis, France

[21] Appl. No.: 502,206

[22] Filed: Jul. 13, 1995

[30] Foreign Application Priority Data

Jul. 21, 1994 [FR] France ................................. 94 09251

[51] Int. Cl.⁶ .................................................. H01L 23/053
[52] U.S. Cl. ......................... 257/701; 257/737; 257/787; 257/778; 257/774
[58] Field of Search .................................. 257/737, 787, 257/778, 774, 692, 701, 738

[56] References Cited

U.S. PATENT DOCUMENTS

| | | | |
|---|---|---|---|
| 5,216,278 | 6/1993 | Lin et al. ................................. | 257/688 |
| 5,293,072 | 3/1994 | Tsuji et al. ............................... | 257/737 |
| 5,293,092 | 3/1994 | Tsuji et al. . | |
| 5,557,150 | 9/1996 | Variot et al. ............................. | 257/787 |
| 5,612,576 | 3/1997 | Wilson et al. ........................... | 257/787 |

FOREIGN PATENT DOCUMENTS

| | | | |
|---|---|---|---|
| 57-079652 | 5/1982 | Japan ............................ | H01L 23/48 |
| 63-146453 | 6/1988 | Japan ............................ | H01L 23/12 |
| 2150042 | 8/1990 | Japan . | |
| 5-63109 | 3/1993 | Japan ............................ | H01L 23/12 |
| 5-299563 | 11/1993 | Japan ............................ | H01L 23/50 |
| 6097666 | 8/1994 | Japan . | |

OTHER PUBLICATIONS

French Search Report from French Patent Application No. 94 09251, filed Jul. 21, 1994.

*Primary Examiner*—Tom Thomas
*Assistant Examiner*—Roy Potter
*Attorney, Agent, or Firm*—Wolf, Greenfield & Sacks, P.C.

[57] ABSTRACT

A casing for mounting an integrated circuit chip includes an insulating plate, on the upper surface of which is disposed the chip. The upper surface is coated with an epoxy resin that extends from the upper surface of the plate up to at least the periphery of the lower surface of the plate.

32 Claims, 2 Drawing Sheets

INJECTION MOLDED BALL GRID ARRAY CASING

BACKGROUND OF THE INVENTION

1. Field of the Invention

The present invention relates to a casing for an integrated circuit chip. More particularly, the invention relates to a casing which includes an insulating plate having an upper surface on which is mounted an encapsulated integrated circuit chip, and a method for its fabrication.

2. Discussion of the Related Art

The insulating plate is, for example, of the type used to form printed circuit boards. A conventional integrated circuit chip typically has terminals on its upper surface connected to connection pads on the upper surface of the insulating plate. A lower surface of the plate includes an array, generally repetitive, of conductive connection bosses or balls. Each ball is connected to one of the connection pads on the opposite surface of the plate through a metallized hole. This type of casing is usually referred to as a BGA (Ball Grid Array) casing. A problem in this type of casing lies in the implementation of the encapsulation.

A first conventional encapsulation process consists of depositing a drop of an epoxy resin, which spreads over the chip and the plate, and is delineated by a barrier constituted by a seam of more viscous epoxy resin. One drawback of this process is that the casing so produced has an uneven surface.

A second conventional encapsulation process consists of injecting epoxy resin in a mold that accommodates the upper surface of the plate carrying the chip. The surface of the epoxy resin of the obtained casing has good characteristics, which allows its marking.

In both processes described above, the epoxy resin is heated to solidify it into a solid state. A drawback in each type of casing formed by the above processes is that the epoxy resin contracts during solidification causing deformation of the plate, which tends to curve towards the chip. This deformation may cause the integrated circuit chip to break, and rendering the circuit unusable. One solution to this problem has been to increase the thickness of the plate, and thus to improve its resistance to deformation. However, this requires the use of plates that are very thick, particularly for large chip surface.

SUMMARY OF THE INVENTION

In one illustrative embodiment of the invention, a casing is provided which includes an integrated circuit chip and an insulating plate. The chip is placed on an upper surface of the insulating plate. The upper surface of the plate is coated with a casing material such as an epoxy resin which extends from the upper surface of the plate to at least the periphery of a lower surface of the plate.

According to another embodiment of the invention, the casing is a BGA casing that includes an array of connection balls on the lower surface of the plate. Each ball is connected to a chip terminal disposed on the upper surface of the plate, a first pad disposed on the surface of the plate, a metallized hole through the plate, and conductive tracks and a second connection pad disposed on the other surface of the plate.

According to another embodiment of the invention, the epoxy resin coats the lower surface of the plate between the connection balls.

According to another embodiment of the invention, the metallized holes are filled with an epoxy resin.

According to still another embodiment of the invention, the connection balls are, once the casing is in its final form, surrounded with the epoxy resin of the lower surface of the plate.

According to yet another embodiment of the invention, the casing includes metallized holes disposed under the chip.

In another illustrative embodiment of the present invention, a process is provided for fabricating an integrated circuit casing, the process including the steps of: providing an insulating plate; depositing an integrated circuit chip on the upper surface of the plate; disposing the chip and the plate in a mold for injecting an encapsulation material; injecting some material into the mold so as to encapsulate the chip on the upper surface of the plate; the mold being formed so that the encapsulation material further extends from the upper surface of the plate up to at least the periphery of the lower surface of the plate.

According to another embodiment of the invention, the process includes the following steps: drilling the plate at predetermined locations where the metallized holes will be subsequently positioned; depositing a conductive layer on the two surfaces of the plate, according to a predetermined pattern of connection track pads connected to the holes; gluing the integrated circuit chip on the upper surface of the plate with a glue layer; connecting the chip to the first pads of the upper surface of the plate, with conductive wires; molding and encapsulating with an epoxy resin while using inserts to define opening areas at which the connection balls will be formed on the second pads; and depositing connection balls on the lower surface of the plate, in the openings defined in the epoxy resin layer by the inserts in the second pads.

The foregoing and other objects, features, aspects and advantages of the invention will become apparent from the following detailed description of the present invention when taken in conjunction with the accompanying drawings.

DETAILED DESCRIPTION

Figure 1:
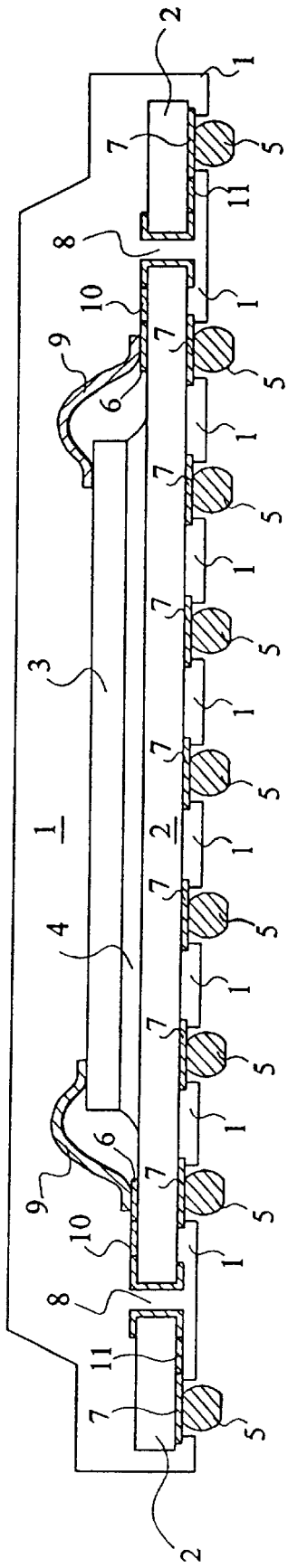
FIG. 1 is a cross-sectional view of an embodiment of a casing for mounting an integrated circuit chip according to the present invention.
Figure 2A:
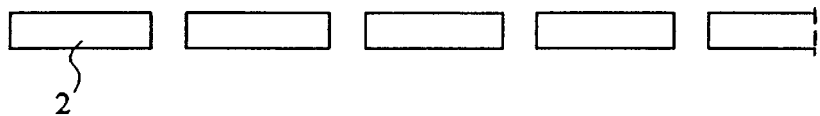
FIGS. 2A–2F illustrate various steps of a process for implementing the mounting of an integrated circuit according to the invention.
Figure 2B:
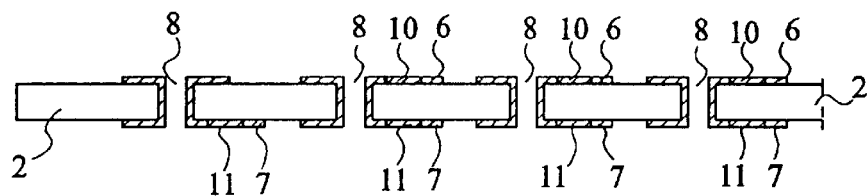
Figure 2C:
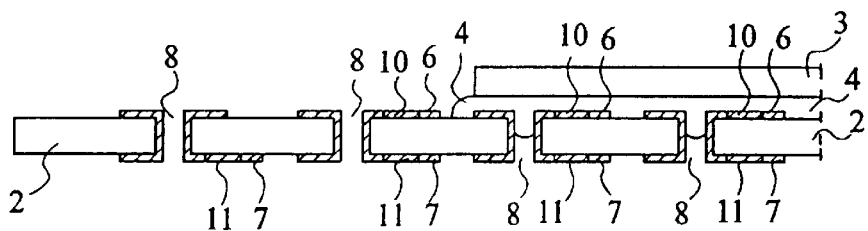
Figure 2D:
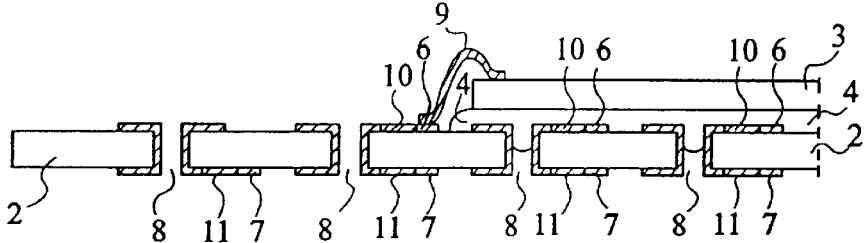
Figure 2E:
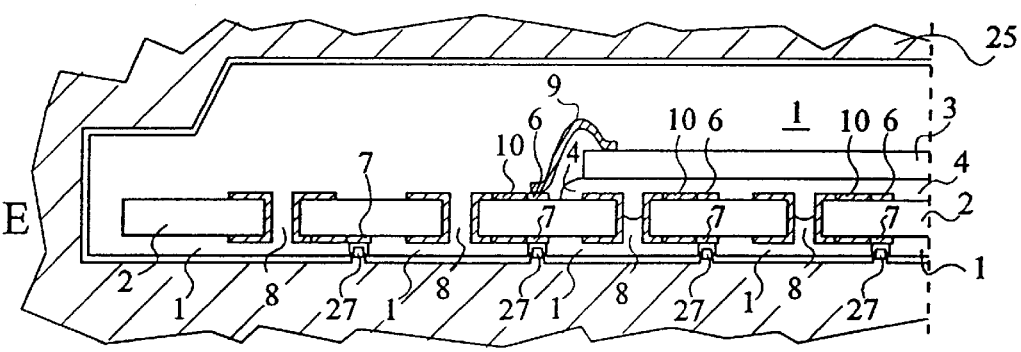
Figure 2F:
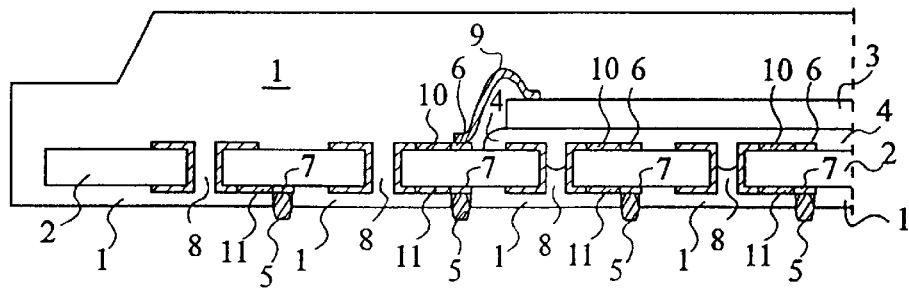

Referring now to the figures, in which like numerals indicate like elements, FIG. 1 is a casing according to the invention. The casing includes an epoxy resin 1 which extends, from an upper surface of an insulating plate 2 carrying an integrated circuit chip 3, up to at least the periphery of the lower surface of plate 2. For the sake of simplification, the figures are not drawn to scale. The chip 3 is bonded on the upper surface of the plate 2 by a glue layer 4.

Preferably, the gaps between balls 5, on the lower surface of plate 2, are also coated with the epoxy resin 1. The thickness of the epoxy resin 1, on the lower surface, is less than the diameter of balls 5.

The connection balls 5 are coupled to terminals of the chip 3 through conductive tracks 10, 11 and connection pads 6 and 7, on the upper surface and lower surface of plate 2, respectively, metallized holes 8 and conductive wires 9. Each terminal of the chip 3 is connected, through a conductive wire 9, to a connection pad 6. Each pad 6 is connected, through a conductive track 10, on the upper surface of plate 2, to a metallized hole 8. On the lower surface, each hole 8 is connected, through a conductive track 11, to a connection pad 7 of a ball 5.

The presence of a casing material, such as the epoxy resin 1, on both surfaces of plate 2 equalizes the stresses caused by the contraction of the epoxy resin 1 during its solidification. Thus, the risk of deformation of the casing which can break the chip, is substantially decreased. Advantageously, this allows the use of a thin plate 2 without risking breakage of the integrated circuit chip 3.

Furthermore, the reliability of the casing is improved since the edges of plate 2 are coated with epoxy resin, and thus penetration of dampness is no longer possible.

In addition, since the epoxy resin 1 may coat the intervals between the connection balls 5 on the lower surface of the plate 2, an insulating photoresist layer is not required on this lower surface. This highly improves the mounting of integrated circuit chips in casings.

In conventional casings, each surface of the insulating plate is coated with an insulating photoresist layer that is etched away at the positions of the pads, corresponding to pads 6 and 7. This insulating photoresist layer, which is deposited on the surfaces of the insulating plate, does not fill metallized holes (such as holes 8) formed through the plate. Since the holes are not filled, air bubbles are trapped between the two photoresist layers. The presence of such bubbles is damaging because they expand when the casing is subjected to heat during subsequent steps of the encapsulation process, or when the integrated circuit is used. These bubbles may cause cracks in the photoresist layer. Because of this risk conventional casings do not provide metallized holes under the chip. Indeed, the occurrence of cracks may damage the chip itself. Such cracks are also detrimental to the insulation of the lower surface of the insulating plate.

The present invention avoids the use of a photoresist layer on the lower surface of the plate since the insulation function is performed by the epoxy resin 1. Since the epoxy resin 1 is more liquid than the usual material used to form the photoresist layer and is molded with a high pressure injection, the resin entirely fills the holes 8. Thus, air bubbles are no longer trapped in the metallized holes 8, and connection balls 5 can be disposed on the lower surface of plate 2 under chip 3.

An exemplary process for mounting integrated circuits according to the invention will be described hereinafter. This example is described with relation to FIGS. 2A–2F, which are partial cross-sectional views of the casing structure according to the invention at different process steps.

In a first step (FIG. 2A), the plate 2 is drilled at places where the metallized holes will be subsequently formed.

In a second step (FIG. 2B), a conductive layer, for example copper, is chemically deposited on the two surfaces of plate 2 to create metallized holes 8 as well as conductive tracks 10, 11 and first and second connection pads 6, 7 on the upper and lower surfaces of plate 2, respectively.

In a third step (FIG. 2C), the chip 3 is bonded to the upper surface of plate 2 with a glue layer 4. The glue at least partially fills the metallized holes 8 which are beneath the chip because of the pressure applied to chip 3 during bonding. Thus, the anchoring of the glue layer 4 is improved while avoiding the formation of air bubbles in holes 8.

In a fourth step (FIG. 2D), the first pads 6 on the upper surface are connected to the terminals of the chip 1 through conductive wires 9, which be may, for example, gold wires. Because of the position of the section plane, only one wire 9 is represented. In practice, wires 9 are provided on all the sides of chip 1.

In a fifth step (FIG. 2E), the whole structure is encapsulated in an epoxy resin 1. This encapsulation is achieved by injection of the epoxy resin into a mold 25. The mold 25 has metallic inserts 27 which are located at the positions of the connection balls 5 which are applied subsequently. The epoxy resin 1, injected under pressure, entirely fills holes 8, this avoids the formation of air bubbles and thus improves the anchoring of the epoxy resin 1 on plate 2 and the reliability of the casing.

In a sixth and last step, balls 5 are deposited on the second connection pads 7 of the lower surface of plate 2 at locations where the inserts of the mold prevented the epoxy resin 1 from being deposited. Hence, the casing shown FIG. 1 is obtained.

The epoxy resin 1 provided over the spaces between the connection balls 5, on the lower surface of plate 2 facilitates the positioning of the connection balls 5. Indeed, the epoxy resin 1 acts as a guide for the positioning of balls 5 at positions where the inserts of the mold prevented the epoxy resin 1 from depositing.

Moreover, this method avoids the possibility of subsequent bond separation of the connection balls 5. In conventional casings, the balls may be separated from the connection pads 7 under the influence of the thermomechanical constraints on the casing when it is mounted on a printed circuit board. The invention takes advantage from the melting to which the balls are subjected during the mounting process and partially embeds them in the epoxy resin 1. This substantially improves their mechanical resistance.

To improve contacts between the components within the casing, a conductive electrolytic coating (not shown) can be formed on both surfaces of plate 2, at an intermediate step between the second and third steps. This coating is, for example, made of nickel and gold, and is provided on the lower surface over the second pads 7, and on the upper surface over the first pads 6 and the metallized holes 8.

The invention does not make use of an insulating photoresist layer, even on the upper surface of plate 2. This result is achieved by entirely coating the upper surface of the plate 2 with the encapsulation epoxy resin 1. The reliability of the casing which results is improved by avoiding any risk of breaking of the chip 3 while allowing the use of a thin plate 2. In addition, the surface area of plate 2 is reduced by allowing the placement of the connection balls 5 under the chip 3. Furthermore, the encapsulation process is simplified by eliminating a deposition and an etching step of a photoresist layer.

As is apparent to those skilled in the art, various modifications can be made to the above disclosed preferred embodiments. More particularly, each layer material described above can be replaced with one or more materials having the same characteristics and/or performing the same function. For example, an insulating photoresist layer can be maintained on the lower surface, and the epoxy resin then coating the whole, or a portion, of the lower surface of plate 2. In this case, the photoresist layer is etched away at places where the connection balls 5 will be subsequently positioned. Similarly, the exemplary succession of steps given by way of example can also be modified depending upon the materials and the deposition and/or etching means that are used.

Although in the above-described example, the casing is applied to a plate 2 including connection balls 5 on its lower surface, the invention applies to any type of casing including an insulating plate coated with an encapsulation material, and with connection pads on its lower surface. For example, the plate can be a multi-layer plate without through holes; connection pads on the lower surface being connected to connection pads on the upper surface through tracks achieved in conductive layers between which insulating layers are interposed.

Also, the invention applies to any shape of casing either square-shaped, rectangular, circular, oval, etc.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A casing for mounting an integrated circuit chip, the casing comprising:

an insulating plate having an upper surface for receiving the chip, a lower surface and a peripheral side surface extending between the upper and lower surfaces, the upper surface, the peripheral side surface and a periphery of the bottom surface each being at least partially coated with an epoxy resin that extends from the upper surface of the plate over the peripheral side surface and further extends from the peripheral side surface onto the periphery of the lower surface of the plate;

a plurality of connection balls disposed on the lower surface of the plate;

a plurality of coupling paths for respectively coupling the plurality of connection balls to the chip, each of the coupling paths including:

a first connection pad disposed on the upper surface of the plate and being couplable to the chip;

a second connection pad disposed on the lower surface of the plate and being coupled to a corresponding one of the plurality of connection balls; and a metallized hole disposed in the plate and coupling the first and second connections pads, wherein the epoxy resin coats the lower surface of the plate between the connection balls.

2. The casing of claim 1, wherein the metallized hole in each of the coupling paths is at least partially filled with the epoxy resin.

3. The casing of claim 1, wherein the connection balls are partially embedded in the epoxy resin covering the lower surface of the plate.

4. The casing of claim 3, wherein the upper surface of the insulating plate includes a chip receiving area for receiving the chip, and wherein at least one of the plurality of metallized holes in the plate is disposed in the chip receiving area.

5. An integrated circuit, comprising:

an insulating plate having a first surface, a second surface and a peripheral side surface extending between the first and second surfaces, an integrated circuit chip mounted to the first surface of the insulating plate;

a casing disposed on the first surface of the insulating plate and encapsulating the chip, a portion of the casing extending from at least a portion of the first surface over at least a portion of the peripheral side surface and further extending from the portion of the peripheral side surface onto at least a peripheral portion of the second surface; and a plurality of connection balls disposed on the second surface of the insulating plate, the plurality of connection balls being connected to the integrated circuit chip, the casing including a portion which is disposed on the second surface between the connection balls.

6. The integrated circuit of claim 5, wherein the first and second surfaces are arranged on opposing sides of the insulating plate.

7. The integrated circuit of claim 5, wherein the casing is an epoxy resin.

8. The integrated circuit of claim 5, wherein the casing covers the entire peripheral side surface of the insulating plate.

9. The integrated circuit of claim 5, wherein the connection balls extend from the plate by a distance, and wherein the portion of the casing disposed on the second surface has a thickness that is less than the distance that the connection balls extend from the insulating plate.

10. The integrated circuit of claim 5, wherein the casing is formed of a single piece.

11. An integrated circuit, comprising:

an insulating plate having a first surface, a second surface and a peripheral side surface extending between the first and second surfaces, the first surface of the insulating plate including a chip receiving area and at least one metallized hole disposed outside the chip receiving area;

an integrated circuit chip mounted to the first surface of the insulating plate in the chip receiving area; and a casing disposed on the first surface of the insulating plate and encapsulating the chip, a portion of the casing extending from at least a portion of the first surface over at least a portion of the peripheral side surface and further extending from the portion of the peripheral side surface onto at least a peripheral portion of the second surface, the at least one metallized hole disposed outside the chip receiving area being substantially filled with the casing from the first and second surfaces.

12. An integrated circuit that is operable within an operating temperature range, comprising:

an insulating plate including first and second surfaces;

an integrated circuit chip mounted to the first surface of the insulating plate;

a casing disposed on the insulating plate and encapsulating the chip on the insulating plate;

a plurality of connection balls disposed on the second surface of the insulating plate, the connection balls being electrically coupled to the chip, a portion of the casing being disposed on the second surface between the connection balls; and means for preventing the insulating plate from bending due to heat when the chip is operated within the operating temperature range.

13. The integrated circuit of claim 12, wherein the insulating plate has a thickness, and the means for preventing bending does not increase the thickness of the insulating plate.

14. The integrated circuit of claim 12, wherein the casing is subjectable to a curing temperature during fabrication of the integrated circuit, and wherein the means for preventing the insulating plate from bending due to heat prevents bending due to heat when the integrated circuit is subjected to the curing temperature.

15. An integrated circuit that is operable within an operating temperature range, comprising:

an insulating plate including first and second surfaces, the first surface of the insulating plate including a chip receiving area and at least one hole in the chip receiving area;

an integrated circuit chip mounted to the chip receiving area of the insulating plate;

a casing disposed on the insulating plate and encapsulating the chip on the insulating plate;

means for preventing the insulating plate from bending due to heat when the chip is operated within the operating temperature range; and means for preventing air from being trapped within the at least one hole disposed in the chip receiving area.

16. The integrated circuit of claim 15, further comprising an adhesive, disposed between the integrated circuit chip and the insulating plate, that affixes the chip to the insulating plate, and wherein the means for preventing includes the casing and adhesive filling the at least one hole disposed in the chip receiving area of the insulating plate.

17. The integrated circuit of claim 16, wherein the insulating plate includes at least one hole disposed outside the chip receiving area, and wherein the integrated circuit further comprises means for preventing air from being trapped in the at least one hole disposed outside the chip receiving area.

18. An integrated circuit comprising:

an insulating plate including a chip receiving area and at least one conductive hole having an inner surface, the at least one conductive hole being disposed in the chip receiving area and being substantially free of air pockets;

an integrated circuit chip mounted to the chip receiving area of the insulating plate;

at least one connection ball disposed on the insulating plate; and a conductive path that electrically couples the integrated circuit chip and the at least one connection ball, the conductive path including a conductive layer disposed on the inner surface of the at least one conductive hole.

19. The integrated circuit of claim 18, wherein the plate includes first and second opposing surfaces, and the chip is mounted on the first surface and the at least one connection ball is mounted on the second surface.

20. An integrated circuit comprising:

an insulating plate having at least one conductive hole having an inner surface and being substantially free of air pockets, the at least one conductive hole extending through the insulating plate;

an integrated circuit chip mounted to the insulating plate;

at least one connection ball disposed on the insulating plate;

a conductive path that electrically couples the integrated circuit chip and the at least one connection ball, the conductive path including a conductive layer disposed on the inner surface of the at least one conductive hole; and a casing encapsulating the integrated circuit chip and substantially filling the at least one conductive hole disposed in the insulating plate.

21. The integrated circuit of claim 20, wherein the insulating plate includes a chip receiving area to which the chip is mounted, wherein the at least one conductive hole is disposed in the chip receiving area, and wherein the integrated circuit further comprises:

an adhesive disposed between the chip and the insulating plate, the adhesive at least partially filling the at least one conductive hole disposed in the chip receiving area.

22. The integrated circuit of claim 20, wherein the insulating plate includes a chip receiving area to which the chip is mounted, wherein the at least one conductive hole is disposed on the insulating plate outside the chip receiving area.

23. The integrated circuit of claim 22, wherein the casing is an epoxy resin.

24. The integrated circuit of claim 23, wherein the insulating plate includes a first surface, a second surface and a peripheral side surface extending therebetween, and wherein a portion of the casing covers at least a portion of the peripheral side surface.

25. The integrated circuit of claim 20, wherein the insulating plate includes a chip receiving area to which the chip is mounted, the at least one conductive hole being disposed within the chip receiving area, the casing filling the at least one conductive hole.

26. An integrated circuit operable within an operating temperature range, the integrated circuit comprising:

an insulating plate having an upper surface and a lower surface, the insulating plate including a chip receiving area and at least one hole disposed in the chip receiving area, an integrated circuit chip mounted to the upper surface of the insulating plate in the chip receiving area;

a casing disposed on the insulating plate and encapsulating the chip;

means for preventing air pockets from forming within the at least one hole disposed in the chip receiving area; and means for preventing the casing from cracking due to bending forces caused by heat when the integrated circuit is operated within the operating temperature range, the means for preventing the casing from cracking being disposed at least partially on the bottom surface of the insulating plate.

27. The integrated circuit of claim 26, wherein the insulating plate has first and second surfaces, and the means for preventing the casing from cracking includes the casing being disposed on both the first and second surfaces of the insulating plate.

28. The integrated circuit of claim 26, further including an adhesive disposed between the chip and the plate that affixes the chip to the plate, and wherein the means for preventing air pockets from forming in the at least one hole in the chip receiving area includes the adhesive and the casing.

29. The integrated circuit of claim 26, wherein the casing is subjectable to a curing temperature during fabrication of the integrated circuit, and wherein the means for preventing the casing from cracking due to bending forces caused by heat prevents the case from cracking when the integrated circuit is subjected to the curing temperature.

30. A casing for mounting an integrated circuit chip, the casing comprising:

an insulating plate having an upper surface for receiving the chip in a chip receiving area, a lower surface and a peripheral side surface extending between the upper and lower surfaces, the upper surface, the peripheral side surface and a periphery of the bottom surface each being at least partially coated with an epoxy resin that extends from the upper surface of the plate over the peripheral side surface and further extends from the peripheral side surface onto the periphery of the lower surface of the plate;

a glue disposed on the upper surface to affix the chip in the chip receiving area;

a plurality of connection balls disposed on the lower surface of the plate; and a plurality of coupling paths for respectively coupling the plurality of connection balls to the chip, each of the coupling paths including:

a first connection pad disposed on the upper surface of the plate and being couplable to the chip;

a second connection pad disposed on the lower surface of the plate and being coupled to a corresponding one of the plurality of connection balls;

a metallized hole disposed in the plate and coupling the first and second connections pads, the metallized hole being a through-hole;

a first conductive track disposed on the upper surface and coupled to the first connection pad and the metallized hole, a portion of the first conductive track lying outside the chip receiving area being covered and in direct contact with the epoxy resin; and a second conductive track disposed on the lower surface and coupled to the second connection pad and the metallized hole;

wherein at least one metallized hole is disposed in the chip receiving area and is substantially filled with glue from the upper surface and epoxy resin from the lower surface.

31. The casing recited in claim 30, wherein another portion of the first conductive track lies in the chip receiving area and is covered and in direct contact with the glue.

32. A casing for mounting an integrated circuit chip, the casing comprising:

an insulating plate having an upper surface for receiving the chip, a lower surface and a peripheral side surface extending between the upper and lower surfaces, the upper surface, the peripheral side surface and a periphery of the bottom surface each being at least partially coated with an epoxy resin that extends from the upper surface of the plate over the peripheral side surface and further extends from the peripheral side surface onto the periphery of the lower surface of the plate;

a plurality of connection balls disposed on the lower surface of the plate; and a plurality of coupling paths for respectively coupling the plurality of connection balls to the chip, each of the coupling paths including:

a first connection pad disposed on the upper surface of the plate and being couplable to the chip;

a second connection pad disposed on the lower surface of the plate and being coupled to a corresponding one of the plurality of connection balls;

a metallized hole disposed in the plate and coupling the first and second connections pads, the metallized hole being a through-hole;

a first conductive track disposed on the upper surface and coupled to the first connection pad and the metallized hole, a portion of the first conductive track being covered and in direct contact with the epoxy resin; and a second conductive track disposed on the lower surface and coupled to the second connection pad and the metallized hole, a portion of the second conductive track being covered and in direct contact with the epoxy resin.

* * * * *